United States Patent
Volk et al.

(10) Patent No.: US 8,917,032 B2
(45) Date of Patent: Dec. 23, 2014

(54) METHOD AND APPARATUS FOR ACTIVE RIPPLE CANCELATION

(71) Applicant: Maxim Integrated Products, Inc., San Jose, CA (US)

(72) Inventors: Karl Richard Volk, Scotts Valley, CA (US); Jason Allen Wortham, Fremont, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/770,976

(22) Filed: Feb. 19, 2013

(65) Prior Publication Data

US 2013/0221869 A1    Aug. 29, 2013

Related U.S. Application Data

(60) Provisional application No. 61/602,507, filed on Feb. 23, 2012.

(51) Int. Cl.

| | |
|---|---|
| *H05B 37/02* | (2006.01) |
| *H03K 5/08* | (2006.01) |
| *H02M 1/15* | (2006.01) |
| *H05B 33/08* | (2006.01) |

(52) U.S. Cl.
CPC ............... *H03K 5/08* (2013.01); *H05B 37/02* (2013.01); *H02M 1/15* (2013.01); *H05B 33/0815* (2013.01); *H05B 33/0827* (2013.01); *Y02B 20/341* (2013.01)
USPC ........................................... 315/299; 315/308

(58) Field of Classification Search
CPC .... H05B 37/02; H05B 33/08; H05B 33/0803; H05B 33/0833; H05B 33/0845; H05B 33/0896
USPC ........................................ 315/291, 299, 308
See application file for complete search history.

(56) References Cited

U.S. PATENT DOCUMENTS

| 7,183,723 | B2 * | 2/2007 | Yu et al. ..................... 315/247 |
|---|---|---|---|
| 7,741,787 | B2 * | 6/2010 | Chen et al. ................. 315/224 |
| 8,198,863 | B1 | 6/2012 | Wortham |
| 8,203,305 | B1 | 6/2012 | Wortham |
| 8,421,364 | B2 * | 4/2013 | Archibald et al. ......... 315/209 R |
| 8,502,504 | B1 | 8/2013 | Wortham |
| 8,643,331 | B1 | 2/2014 | Wortham |
| 2010/0327835 | A1 * | 12/2010 | Archibald .................. 323/282 |
| 2013/0002165 | A1 * | 1/2013 | Rouvala et al. ............ 315/294 |

* cited by examiner

*Primary Examiner* — Thuy Vinh Tran
(74) *Attorney, Agent, or Firm* — North Weber & Baugh LLP

(57) ABSTRACT

Various embodiments of the invention allow for active AC ripple noise cancellation. In certain embodiments, noise cancellation is accomplished by modulating an LED driver output in a polarity opposite to the ripple, thereby, preventing interference with ripple-sensitive loads. Certain embodiments take advantage of a filter network to prevent the LED driver from modulating LED current in response to ripple that falls within a visible frequency range so as to prevent flicker in an LED backlight display. In addition to protecting ripple-sensitive loads from large ripple currents, efficiency is increased by reducing both $I^2 \cdot R$ losses and peak currents, thereby, extending the useful battery life time in mobile devices.

20 Claims, 9 Drawing Sheets

METHOD AND APPARATUS FOR ACTIVE RIPPLE CANCELATION

CROSS REFERENCE TO RELATED PATENT APPLICATIONS

The present application claims priority to U.S. Provisional Application Ser. No. 61/602,507 titled "Method and Apparatus for Active Ripple Cancellation," filed on Feb. 23, 2012 by Karl Richard Volk and Jason Allen Wortham, which application is incorporated herein by reference in its entirety.

BACKGROUND

A. Technical Field

The present invention relates to noise cancellation in battery DC-operated systems, and more particularly, to systems, devices, and methods of actively cancelling the effects of main system power rail AC ripple on noise-sensitive subsystems. The present invention also relates to display backlighting in said systems.

B. Background of the Invention

A typical battery-operated system is sensitive to noise generated by sub-systems and/or dynamic loads within the overall system. For example, as loads turn on and off, or change their power levels, a ripple current or voltage may be generated on a proximate signal or system power rail that supplies power to various loads. Active components such as the core processor, RF power amplifier, audio amplifiers, etc., represent potential sources of ripple within these systems. This ripple can be especially large in battery-operated systems because batteries tend to have high source impedance.

There are many potential problems associated with AC ripple occurring on the main system rail. Ripple voltage and ripple current can couple noise into various noise-sensitive sub-systems within a typical device and cause increased RMS losses in the source impedance, which includes the battery resistance, contact resistance, disconnect FETs, battery current sense resistor, trace resistance, etc. This reduces efficiency, increases heat dissipation and, for systems with batteries, reduces battery run time. A major problem created by ripple is that it causes early termination of systems that require a minimum operating voltage. Smart phones, for example, terminate operation when their battery or system voltage falls to about a 3.4 V minimum voltage. Large voltage ripple greatly contributes to reaching this lower end of the useful operating range faster causing premature termination and reduced effective battery run time.

SUMMARY OF THE INVENTION

Various embodiments of the invention provide for active ripple cancellation. In particular, certain embodiments of the invention provide for cancellation of an AC ripple noise caused by the presence of the dynamic load currents in battery-operated LED backlighting applications that have a shared main system power rail. In certain embodiments, an output current of an LED driver is modulated in a polarity opposite to the ripple caused by dynamic system loads so as to minimize or cancel the total system ripple on the main system power rail and, thus, prevent interference with ripple-sensitive subsystems. In various embodiments, the ripple signal is sensed at the power rail and used to dynamically adjust the output current of an LED driver to adjust the luminescence of an array of LEDs.

Certain embodiments of the invention take advantage of a filter network to prevent an LED driver from modulating LED current in response to ripple that falls within a visible frequency range so as to prevent flicker in an LED backlight display. A filtered signal is combined with a reference signal and used to modulate a driver input signal in opposite polarity to the ripple on the main system power rail, thereby, actively canceling some or all of the ripple. In one embodiment, individual filters are independently adjusted as a function of a run time of a battery.

Certain features and advantages of the present invention have been generally described here; however, additional features, advantages, and embodiments are presented herein will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

Figure ("FIG.") 1 is a general illustration of a portable, battery-driven system having AC ripple on a main system power rail.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Figure 1:
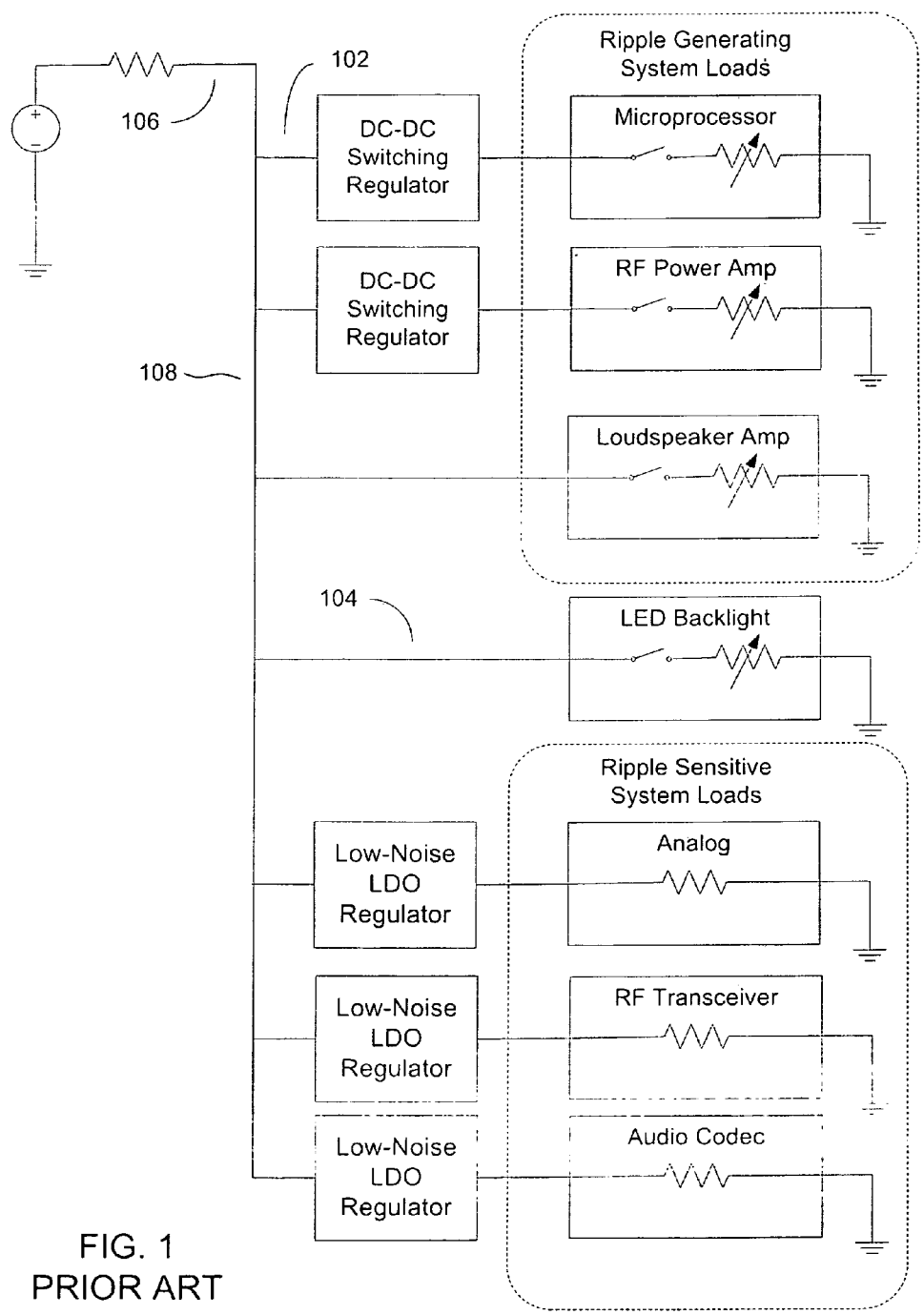

FIG. 1 generally illustrates a portable system having a battery for providing power to a main system power rail. Multiple sub-systems and loads are attached to the power rail, some of which generate ripple that couples onto the rail while some are sensitive to the generated ripple.

A typical battery-operated electrical circuit can be divided into various sub-systems, each representing an independent load. Most commonly, the main system power rail supplies voltage and current to each of these independent loads. In portable equipment, the main system power rail voltage often is the battery voltage. In non-portable equipment, it is usually a regulated voltage, such as 5 V or 3.3 V. Some loads, such as microprocessor cores, connect to the main system power rail through additional regulators that convert the voltage to an appropriate range.

The total loading on the main system power rail can be very dynamic. Loads may require highly variable current or voltage, especially when turning on or off. The dynamic loading causes the main system power rail to experience current and voltage ripple. The current ripple is simply the sum of all the dynamic load currents. The voltage ripple is caused by the current ripple passing through the finite source resistance in the main system supply's output, e.g., a regulator or a battery. In a battery-powered main system rail, the source impedance is the sum of many resistances, including battery resistance, battery protection MOSFET on-resistance, battery protection current sense resistance, battery terminal contact resistance, battery disconnect switch resistance, battery fuel-gauge coulomb counter sense resistance, PCB trace resistance, etc. All these resistances can be lumped together into one main system power rail source resistance, Rsource. As current ripple passes through $R_{SOURCE}$, the main system power voltage experiences voltage ripple per Ohm's law, $dV=dI \cdot R_{SOURCE}$.

Ripple on the main system power rail is undesirable for many reasons. First, since the main system power rail is shared by all subsystems, voltage ripple generated by dynamic loads is present at power inputs of all other loads, some of which may be very sensitive to ripple and noise. Therefore, ripple that is generated by dynamic loads may be coupled into ripple-sensitive loads. Although low-dropout (LDO) linear regulators can reject the ripple to prevent it from coupling into sub-systems, LDOs have only finite ripple rejection capability, so that some ripple still passes through. It would be desirable to have a system that reduces voltage ripple on the main system power rail and, thereby, reduces interference with high-sensitivity sub-systems.

Increased RMS current associated with current ripple on the main system power rail further causes increased $I^2R$ losses in $R_{SOURCE}$. In a battery-powered system, this results in a shorter battery run time. Therefore, it would be desirable to have a system that reduces current and voltage ripple on the main system power rail to reduce $I^2R$ heating and, thus, extend battery run time.

Further, when multiple dynamic loads operate at high peak loads at the same time, the battery voltage will drop significantly. Due to all the distributed resistances that make up $R_{SOURCE}$, the main system supply voltage will drop even further than the battery voltage. This may cause greatly shortened battery run time due to the lowest acceptable system operating voltage, the end of life voltage (EOL), being reached earlier as the battery is discharged sooner. A prime example of this are mobile handsets operating on Li-ion batteries that when fully charged start at 4.2 V and discharged down to 3.0 V. EOL in such devices is often specified in the 3.2 V or 3.4 V region. In such a system, a heavy peak load on the main system power rail may cause the rail voltage to momentarily drop to the EOL level, greatly shortening the battery run time. It would be desirable to have a system that reduces peak currents in battery-powered equipment to prevent premature triggering of an early EOL event and, thereby, extends battery run time.

Loads that are powered through intermediate DC-DC switching regulators exhibit constant-power loading on the main system power rail, i.e., for a given voltage and current at the processor, the main system power rail's current must increase as its voltage drops in order to keep the power output constant, thereby further increasing $I^2R$ losses in $R_{SOURCE}$. Therefore, when multiple dynamic loads are operating at high current, the main system voltage drops, and the battery current must increase, which drains the battery more quickly. As an example, if a microprocessor core requires a short-duration 3 A pulse at 1.5V, its loading is equivalent to 4.5 W. Assuming that the DC-DC regulator has 90% efficiency, the load on the main system power rail will draw 4.5 W/0.9=5 W of power. Assuming that the main power rail nominally operates at 4 V, the load current that the battery must provide equals 5 W/4 V=1.25 A. However, if power requirements of other loads running simultaneously are such that they cause the main system power rail voltage to drop from 4 V to, for example, 3.7 V, then the battery current must increase to 5 W/3.7 V=1.35 A to support the same 3 A microprocessor pulse (not including the other loads). The increased current requirement will further increase $I^2 \cdot R$ losses and drain the battery more quickly due to the drop.

One known method to reduce a ripple on the main system power rail is to enable and disable different subsystems at different times such that their peak loads do not occur simultaneously. As an example, this is done in some mobile camera phones to temporarily reduce LED camera flash current during the GPRS/GSM transmit burst by using a signal from the RF transmitter. However, many ripple-generating loads have no convenient signals available with which other loads can be blanked, and most sub-systems cannot be arbitrarily modulated to reduce power consumption without causing counter-productive effects.

Figure 2:
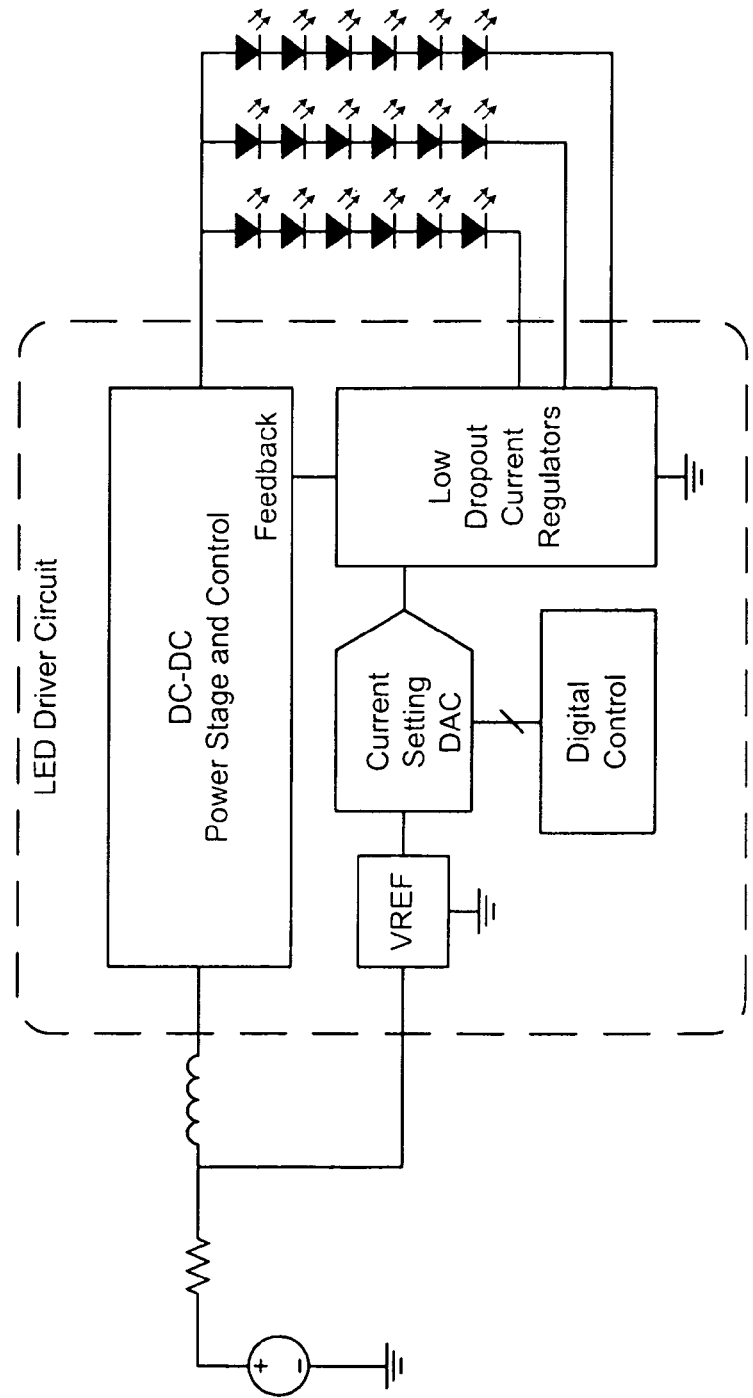
FIG. 2 illustrates a prior art backlight regulation circuit utilizing a voltage reference block to stabilize output voltage, current, or power.

FIG. 2 illustrates a prior art circuit for a typical LED backlight driver circuit utilizing a voltage reference block, VREF. An LED backlight driver is generally considered a load that cannot be modulated to offset other system loads. This is because the human eye is sensitive to brightness variations within a certain frequency range, and such variations would be perceived as unwanted flicker. LEDs emit light energy that is largely proportional to the current flowing through them. Therefore, the LED driver circuits convert power from the main system power rail into a constant but adjustable output current to the LED backlight. As shown in FIG. 2, the LED driver circuit usually contains a reference block, VREF, which exhibits relatively high ripple rejection to prevent input ripple from causing visible flicker at the LED backlight.

Figure 3:
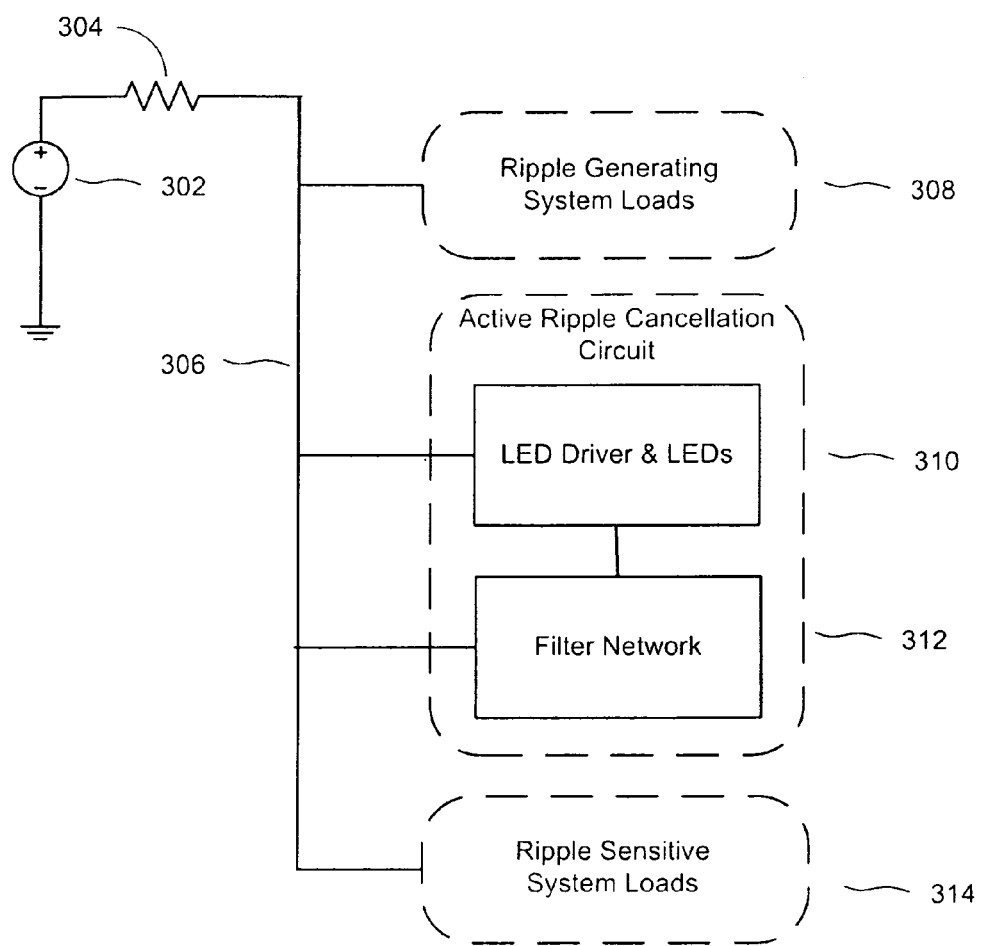
FIG. 3 is a schematic of an illustrative active ripple cancellation circuit according to various embodiments of the invention.

FIG. 3 is a schematic of an illustrative active ripple cancellation circuit according to various embodiments of the invention. A power source 302, for example, a battery having an effective internal source resistance, $R_{SOURCE}$, 304, which includes contributions from various impedances, such as battery internal resistance, contact resistance, trace resistances, etc. is electrically connected to main system power rail 306 that supplies power to various loads in the system. Rapid power level changes in dynamic sub-systems 308, such as core processors, RF power amplifiers, and audio amplifiers turning on or off, are associated with high di/dt that causes a voltage drop across $R_{SOURCE}$, 304. The voltage drop can be especially large in systems with high source impedance, such as battery-driven systems, and can result in large ripple currents that couple into the main system power rail 306 affecting ripple-sensitive loads 314, such as RF transceivers, sensors, and cameras.

In various embodiments, output current of LED driver 310 may be modulated in a polarity opposite to the ripple caused by these dynamic system loads 308 to minimize or cancel the total system ripple on main system power rail 306 and to prevent interference with ripple-sensitive loads 314.

LED driver 310 monitors ripple on main system power rail 306 by sensing the voltage or current ripple, and uses the ripple signal to dynamically change the output current of LED driver 310, which, in turn, changes the luminescence of the LEDs. Filter network 312 may be used to selectively modulate the output current of LED driver 310 to prevent modulation at frequencies that would be perceived by the human eye as flicker in the LEDs.

Figure 4:
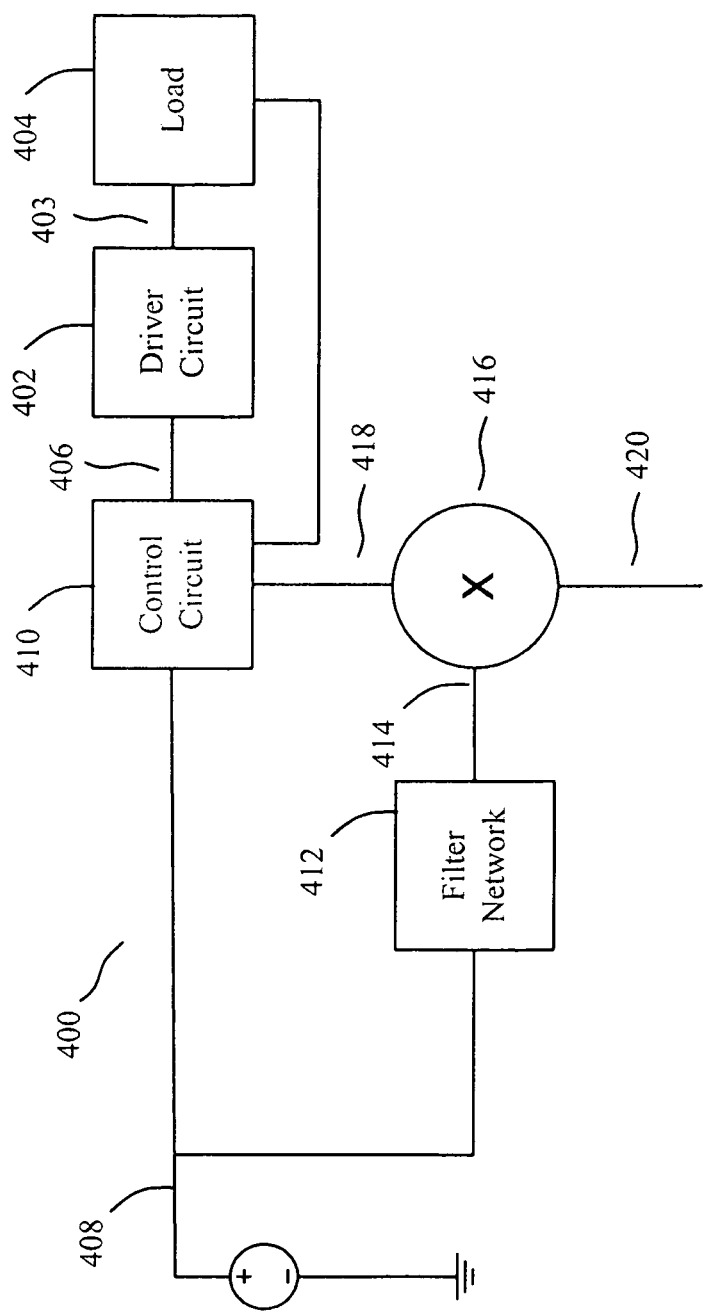
FIG. 4 is an exemplary block diagram of an active ripple cancellation circuit according to various embodiments of the invention.

FIG. 4 is an exemplary block diagram of an active ripple cancellation circuit 400 according to various embodiments of the invention. In response to driver input signal 406, driver circuit 402 converts power from main system power rail 408 into an output current or voltage signal 403 to drive external load 404. Control circuit 410 receives a ripple signal that is representative of noise caused at least in part by a section of the circuit external to driver circuit 402 or control circuit 410.

Filter network 412 includes a filter, such as a low pass, a high pass, or any combination thereof, capable of filtering out the ripple signal frequencies in a prescribed range. Filter network 412 may further comprise amplifier circuits to amplify AC ripple signals of certain frequencies. The output of filter network 412 may be electrically combined in a combiner 416 (e.g., a multiplier) with a reference signal 420 (e.g., a user setpoint signal). The output signal of combiner 416 is then provided to control circuit 410 to generate driver input signal 406.

The output of combiner 416 is thus provided to control circuit 410 to modulate the driver input signal 406 in opposite polarity to the ripple on the main system power rail 408, thereby actively canceling some or all of the ripple caused by the presence of the dynamic loads.

The reduced ripple results in lower RMS power losses in the source impedance and, in systems that run on batteries, in a longer battery run time while keeping average power output to external load 404 constant.

There are very few loads in a typical system that can be easily modulated to cancel ripple without negatively impacting performance. One such application is LED backlighting since aggressive changes in backlight brightness are substantially unnoticeable at frequencies outside of the human eye's response range to brightness variations.

As will be discussed below, in LED backlighting applications, a filter network may distinguish ripple frequencies that can be seen by the human eye versus those that cannot. Such a filter may be used to prevent an LED driver from modulating LED current in response to ripple that falls within the visible frequency range, thereby, preventing amplification of flicker that would be noticeable in an LED backlight display.

Figure 5:
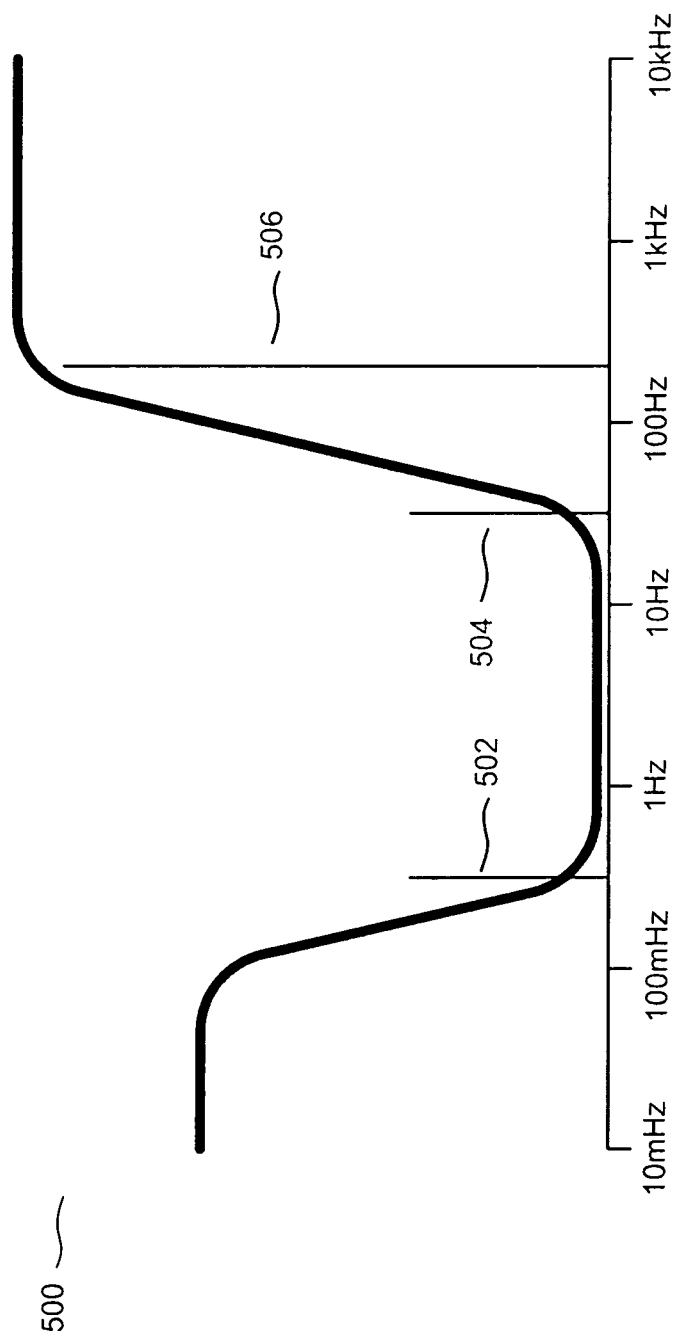
FIG. 5 illustrates an exemplary filter characteristic according to various embodiments of the invention.

FIG. 5 illustrates an exemplary filter characteristic 500 of the filter network according to various embodiments of the invention. As shown, the filter network has a stop band characteristic with a rejection region extending from, for example, 300 mHz 502 to 30 Hz 504. While LEDs turn on and off in nanoseconds, it is flicker in that region which corresponds to the human-eye's frequency range of sensitivity, with 3 Hz pulsing being the frequency of maximum sensitivity to variations in luminescence.

It should be understood that the stopband frequency range may be extended to cover visually not noticeable frequencies. For example, flicker around 30-200 Hz that is not usually noticeable but may be excluded to minimize potential for interference with display refresh rates. Similarly, more complex filtering may be employed, such as band-pass filtering to prevent the low pass region from extending to DC, i.e. 0 Hz.

In another embodiment, the filter network may comprise a high-pass filter that passes frequencies above 30 Hz, which is a common frame-rate for video images, therefore, modulating LED backlight at frequencies greater than 30 Hz does not cause visible flicker. The high pass filter gain may be set very high, for example, such that the largest ripples correspond to a full-scale 0%-200% change in LED backlight current. Since, in practice, the modulation of the backlight current reduces the ripple, the gain may be set even higher. If the gain is set too low, ripple cancellation becomes ineffective. Additionally, the high pass filter's passband may encompass frequencies at which ripple can be expected. A prime example is the GPRS/GSM transmit timeslot burst rate at 216 Hz 506.

In addition to a high pass filter, a low pass filter that allows frequencies below 300 mHz to pass may be used. The low pass filter may extend all the way down to DC. The low pass filter's gain may be independently adjustable from that of the high-pass filter, and it is set relatively lower than that of the high pass filter such that adjustments to LED brightness remain subtle and substantially undetectable by the human eye. In this way, when the battery sustains heavy system loads for an extended period of time, e.g., for more than a few seconds, the backlight is gradually dimmed by a small amount, thereby reducing the overall loading on the main system power rail and the battery.

Because this brightness is changed slowly and by only a small amount, it is unnoticed by the human eye, which has a subjective perception of brightness that decreases approximately logarithmically as physical luminescence decreases linearly. As a result, the LED current can be reduced from, for example, 100% luminescence at the voltage for a full battery to 70% luminescence at the voltage of an empty battery. While this represents more than 30% power savings in backlight power, the reduction in luminescence equals only LOG2 (0.7)=−0.5 E V of equivalent exposure compensation (to put in terms of a digital camera adjustment). This is considered a small change in perceived brightness.

The filter network may operate continuously, or it may be timed, for example, by imposing a duty cycle. The duty cycle may be variable in ratio as well as in modulation depth in order to further minimize the visible and non-visible effects of flicker.

The filter gains may also be made dependent on the run time of the battery to reduce ripple cancellation and modulation as the overall battery power decreases since the visible and non-visible effects of flicker are more pronounced at dimmer lighting conditions. The order of a filter can be determined by considering the attenuation in the stopband region, etc.

It should be understood that, the filter network may be placed at a different location with respect to the LED driver circuit. As an example, a filter with inverted characteristic could be placed in the feedback path of the LED driver allowing the ripple to be sensed without any filtering.

One skilled in the art will appreciate that the functionality of the filter may be realized using various different designs, such as a passive network, an active filter circuit, a switched-capacitor type filter circuit, a digital filter, a DSP, a software routine, etc., so long as the net effect of the filter is to cancel ripple at some frequencies, while not cancelling ripple at other frequencies.

Figure 6:
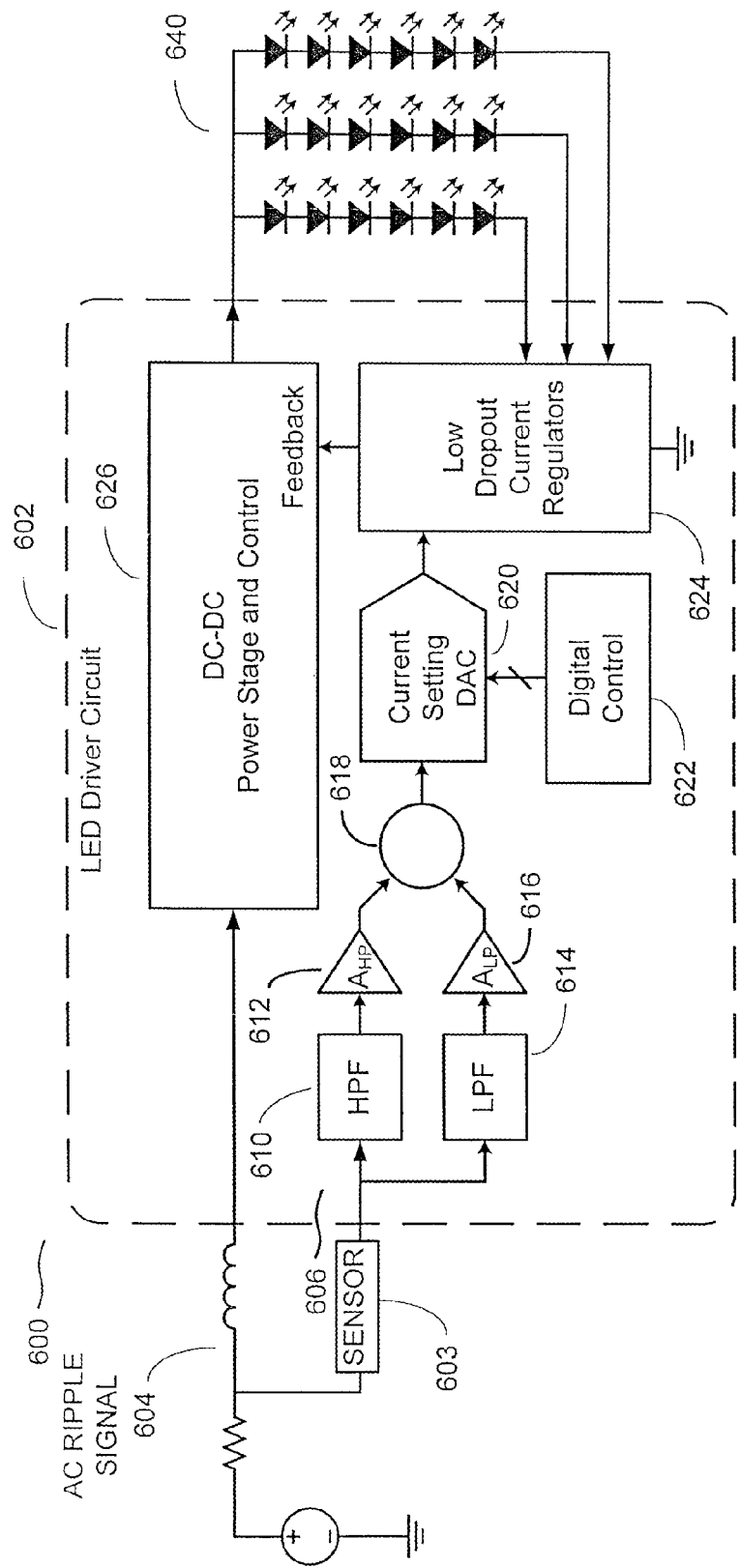
FIG. 6 illustrates a ripple cancellation circuit as applied to LED backlighting according to various embodiments of the invention.

FIG. 6 illustrates a ripple cancellation circuit as applied to LED backlighting according to various embodiments of the invention. LED driver circuit 602 converts power from the main system power rail 604 into an output current to drive LED backlight display 640.

Ripple detected on main system power rail 604, for example, by using a current or voltage sensor at 603, is monitored by LED driver circuit 602. The ripple signal is representative of noise caused at least in part by a section of the circuit external to LED driver circuit 602. The ripple signal is provided to filter network 606 of LED backlight driver circuit 602. LED backlight driver circuit 602 outputs a current to drive an LED backlight display 640.

Filter network 606 may be designed to exhibit a stop band characteristic that heavily attenuates ripple signals that fall within a critical frequency range of visible flicker while amplifying frequencies below and above that range. Filter network 606 may comprise both high pass filter 610 and low pass filter 614. High pass filter 610 is electrically connected to high-pass gain 612 having a first gain setting. Low pass filter 614 is electrically connected to low-pass gain 616 having a second gain setting.

The outputs of high-pass gain 612 and low-pass gain 616 are combined by combiner 618 (e.g., a summing circuit) and provided to DAC 620 to modulate the backlight current setpoint that may have been pre-set by digital controller 622, for example as a user setpoint signal for controlling the brightness level of LED backlight display 640. DAC 620 modulates the backlight current in opposite polarity to the ripple on the main system power rail 604, thereby actively canceling some of the ripple that is caused by the presence of the dynamic loads. Slow changes in the brightness of LED backlight display 640 at frequencies lower than the human eye's response remain unnoticeable. Similarly, changes in the brightness above the human eye's response go unnoticed without causing visible LED flicker.

As a result, the power to LED backlight display 640 can be heavily modulated to cancel ripple above 30 Hz and below 300 mHz without causing noticeable flicker, as long as the average backlight power and thus the average backlight brightness in the visible frequency range is held constant. As discussed, the reduced ripple results in lower power losses in the source impedance and, in systems that operate on batteries, results in a longer battery run time.

One skilled in the art will appreciate that an additional voltage reference block may be used to receive the ripple signal from main system power rail 604 and to filter out all ripple equally to generate a reference signal, VREF, which may be also connected to combiner 618 (e.g., a summing circuit).

Figure 7:
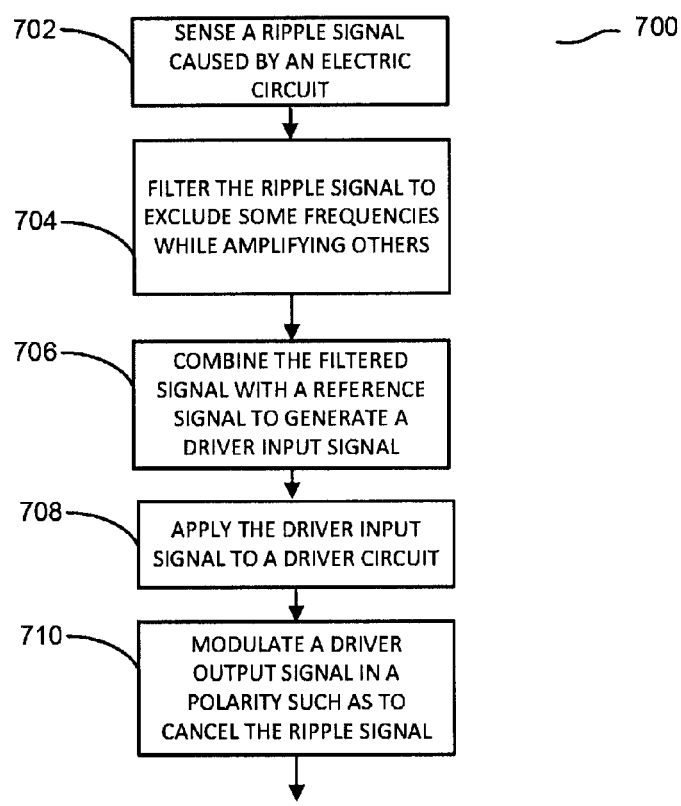
FIG. 7 is a flowchart of an illustrative process for ripple cancellation in accordance with various embodiments of the invention.

FIG. 7 is a flowchart of an illustrative process for ripple cancellation in accordance with various embodiments of the invention. Ripple cancellation begins at step 702, by sensing a ripple signal caused by an electric circuit. The ripple signal may be a voltage or a current signal.

At step 704, the ripple signal is filtered to exclude one or more ranges of frequencies while amplifying one or more ranges of frequencies.

At step 706, the filtered signal is combined with a reference signal, such as a setpoint, which may be a user-provided setpoint, or a voltage reference block, to generate a driver input signal. The driver may be a current or voltage driver and, at step 708, the driver input signal is applied to a driver circuit.

At final step 710, the driver's output signal is modulated in a polarity such as to cancel the ripple signal. Depending on whether the sensed ripple signal is a current signal or voltage signal, the polarity of the filtered signal may be opposite.

Figure 9:
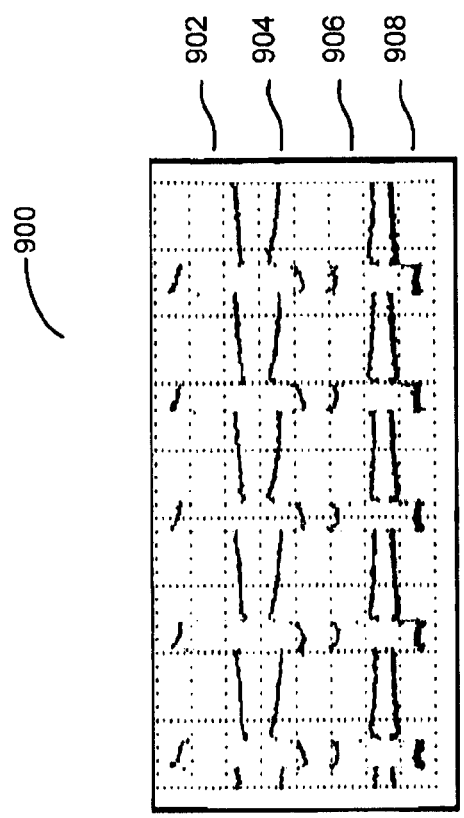
FIG. 8 and FIG. 9 show experimental data taken from an oscilloscope to demonstrate the benefits of Active Ripple Cancellation (ARC) using an LED backlight driver.
Figure 8:
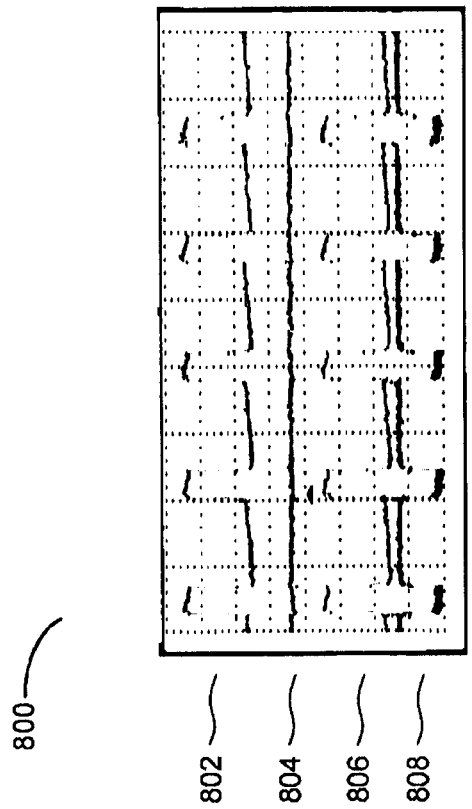

FIG. 8 and FIG. 9 show experimental data taken with an oscilloscope to demonstrate the benefits of Active Ripple Cancellation (ARC) using an LED backlight driver. A small-scale prototype was built and battery run-down testing was performed. The prototype and experimental setup were scaled to mimic a typical Tablet PC application similar to the topology of FIG. 1.

Referring to FIG. 8, oscilloscope traces 800 were measured at various locations of the experimental setup with ARC disabled. Cross-referencing FIG. 1, the first trace 802 in FIG. 8 represents the measured input current ripple to DC-DC switching regulator 102. The second trace 804 in FIG. 8 represents the measured input current ripple of LED backlight driver 104. The third trace 806 in FIG. 8 represents the measured total battery current ripple 106. Finally, the fourth trace 808 in FIG. 8 represents the measured voltage ripple on main system power rail 108. Similarly, in FIG. 9, oscilloscope traces 900 were measured at the same locations of the experimental system as traces 800 of FIG. 8; however, with ARC enabled.

Now, a comparison of trace 804 in FIG. 8 with trace 904 in FIG. 9 shows that no current ripple enters LED backlight driver 104. Thus, trace 804 in FIG. 8 is substantially zero, whereas trace 904 in FIG. 9 indicates that with ARC enabled the LED driver modulates the current entering LED backlight driver 104 in opposite polarity to the current ripple measured at DC-DC switching regulator 102, as shown in trace 902.

The sum of the two current ripples in traces 902 and 904 is shown as total battery current trace 906, which is reduced in FIG. 9. vs. FIG. 8. Even with 30 LEDs, the LED driver current could not be modulated enough to fully offset the entire DC-DC current, so total battery current ripple could not be fully cancelled. But even with partial cancellation, the voltage ripple reduced by about 30% peak-to-peak, as seen by comparing voltage ripple traces 908 and 808.

Figure 10:
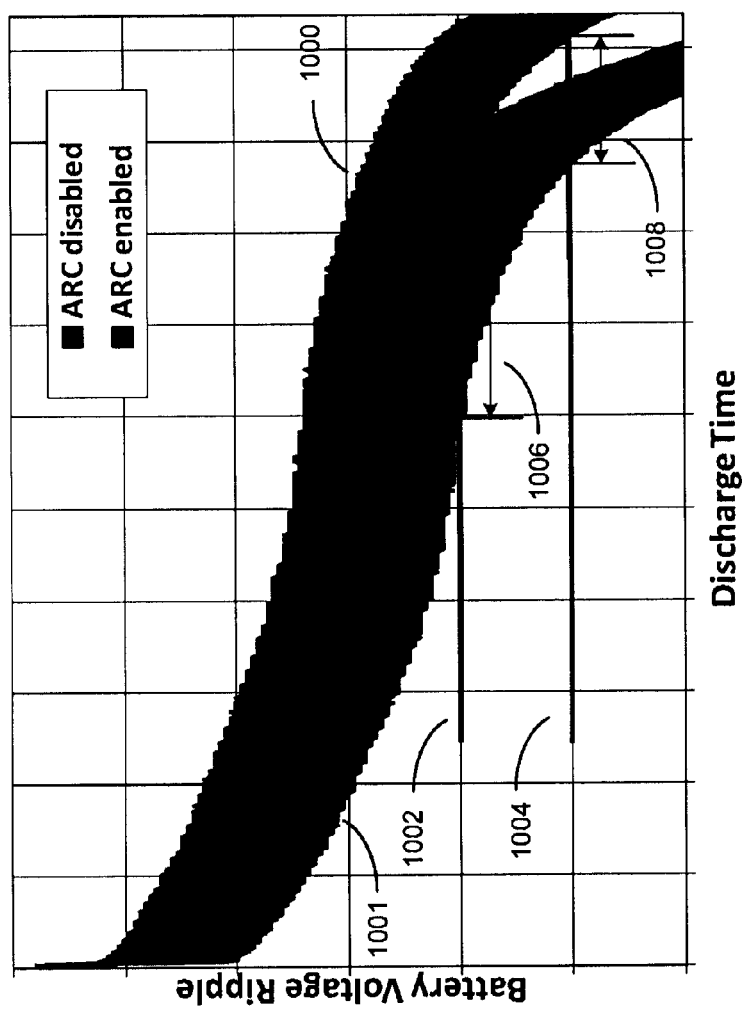
FIG. 10 shows experimental data demonstrating a battery run-down with and without Active Ripple Cancellation (ARC) enabled.

FIG. 10 shows experimental results of a battery run-down test comparing the discharge behavior of a battery using ARC with a battery not using ARC. Battery (main system power rail) voltage and ripple is plotted versus discharge time. A completely full battery is discharged to a pre-defined minimum battery operating voltage, defined as end of life (EOL) voltage, while battery and ripple voltages are monitored.

The smaller, upper area 1000 represents voltage ripple when ARC is enabled, whereas the larger, lower area 1001 represents voltage ripple when ARC is disabled. As indicated by the smaller area 1000, ripple is reduced when ARC is enabled. Further, when ARC is enabled, the discharge time is significantly extended.

Lines 1002 and 1004 represent two different EOL voltages. As shown, for the higher EOL voltage threshold 1002, the battery life increased more than for the lower EOL voltage threshold 1004.

It will be appreciated to those skilled in the art that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention. It is, therefore, intended that the claims in the future non-provisional application will include all such modifications, permutation and equivalents as fall within the true spirit and scope of the present invention.

We claim:

1. A driver circuit for canceling ripple in a signal, the circuit comprising:
    a filter network coupled to receive a first input signal, the first input signal having a ripple, the filter network modifies the first input signal to exclude frequencies in a first set of prescribed ranges to generate a modified input signal;
    a controller coupled to receive both the modified input signal from the filter network and a setpoint signal, the controller modulates the setpoint signal in a relationship opposite to the ripple to generate a control signal; and
    an output stage coupled to receive the first input signal and the control signal to generate an output signal comprising a reduced ripple when compared to the first input signal.

2. The circuit according to claim 1, wherein the filter network comprises an amplifier circuit, the amplifier circuit amplifies frequencies in a second set of prescribed ranges.

3. The circuit according to claim 1, the filter network comprising a combination of high pass and low pass elements that are independently adjustable to exclude the frequencies in the first set of prescribed ranges.

4. The circuit according to claim 1, wherein the setpoint signal is a programmable current signal.

5. The circuit according to claim 1, wherein the filter network comprises at least one stopband filter characteristic adapted to suppress the amplification of the frequencies in the second set of prescribed ranges.

6. The circuit according to claim 5, wherein a second set of prescribed ranges comprises frequencies in the visible range.

7. The circuit according to claim 1, wherein the ripple on the first input signal is representative of noise that is caused at least in part by an electric circuit comprising a main system power rail.

8. The circuit according to claim 1, further comprising a first combiner coupled to the filter network, the first combiner combines a high pass element and a low pass element to generate the modified input signal.

9. The circuit according to claim 1, wherein the circuit is integrated into an LED backlight driver circuit.

10. The circuit according to claim 1, further comprising a reference signal coupled to the circuit.

11. The circuit according to claim 10, wherein the reference signal is a voltage reference block.

12. The circuit according to claim 10, further comprising a second combiner coupled to the filter network, the second combiner combines the modified input signal with the reference signal to generate the control signal.

13. The circuit according to claim 1, further comprising a sensor coupled to the main system power rail to detect the first input signal.

14. A method of canceling an AC ripple signal, the method comprising:
    receiving a first signal having a ripple;
    filtering out a first set of frequencies from the first signal;
    amplifying a second set of frequencies of the first signal;
    modulating a setpoint signal in a relationship opposite to the ripple to generate a control signal; and
    applying the control signal to an output circuit to generate an output signal having a reduced ripple in relation to the first signal.

15. The method according to claim 13, wherein the filter network selectively amplifies the second set of frequencies of the first signal based on a run time of a battery.

16. A system to cancel an AC ripple signal, the system comprising:
    a filter network coupled to receive a first input signal having a ripple, the filter network modifies the first input signal to exclude frequencies in a first set of prescribed ranges to generate a modified input signal;
    a current setting element coupled to receive the modified input signal from the filter network and to modulate a setpoint signal in a relationship opposite to the ripple;
    a controller coupled to the current setting element, the controller generates a control signal in response to the setpoint signal;
    an output stage coupled to receive the first input signal and the control signal to generate an output signal comprising a reduced ripple when compared to the first input signal; and
    a plurality of LEDs coupled to the output stage.

17. The system according to claim 15, wherein the output stage dynamically changes the driver output signal to change a luminescence of the plurality of LEDs.

18. The system according to claim 16, wherein the filter network is located within an LED driver circuit.

19. The system according to claim 16, wherein the filter network selectively amplifies frequencies in the first input signal based on a run time of a battery.

20. The system according to claim 16, wherein an average value of the driver output signal remains substantially constant.

* * * * *